United States Patent
Malhi

Patent Number: 5,525,814
Date of Patent: Jun. 11, 1996

[54] THREE DIMENSIONAL INTEGRATED LATCH AND BULK PASS TRANSISTOR FOR HIGH DENSITY FIELD RECONFIGURABLE ARCHITECTURE

[75] Inventor: Satwinder Malhi, Garland, Tex.

[73] Assignee: Texas Instruments Incorporated, Dallas, Tex.

[21] Appl. No.: 375,143

[22] Filed: Jan. 19, 1995

[51] Int. Cl.$^6$ .................. H01L 29/786; H01L 27/11
[52] U.S. Cl. ................. 257/67; 257/74; 257/69; 257/903; 365/189.05; 365/188
[58] Field of Search .................. 257/67, 74, 69, 257/350, 351, 903, 529, 209; 365/188, 176, 189.05

[56] References Cited

U.S. PATENT DOCUMENTS

| | | | |
|---|---|---|---|
| 5,086,331 | 2/1992 | Hartgring | 257/529 |
| 5,095,347 | 3/1992 | Kirsch | 257/903 |

*Primary Examiner*—Jerome Jackson, Jr.
*Attorney, Agent, or Firm*—Jacqueline Garner; Jim Brady; Richard L. Donaldson

[57] ABSTRACT

A three dimensional latch and bulk silicon pass transistor for high density field reconfigurable architectures is provided utilizing bulk silicon with a layer of polysilicon or silicon on insulator (SOI) thereover. The pass transistor, which must have very low resistance to provide a good short circuit path between the metal runs and fast switching speed, is fabricated in the bulk silicon wherein the resistivity can be made very low relative to polysilicon and because only the pass transistor is disposed in the bulk silicon, thereby permitting the dimensions thereof to be increased to provide even lower resistance. Since only the latch is fabricated in the layer of polysilicon or SOI and is disposed over the pass transistor, the amount of chip area utilized can be the same or less than required in the prior art wherein all circuitry was in the bulk silicon. While the resistivity in the polysilicon will be higher than in the bulk silicon, the latch can operate adequately under such conditions of high resistivity since high speed operation thereof is not of importance in the environment in question. The very low resistance path of the pass transistor allows for faster response time than can be obtained in polysilicon for reconfiguration operations.

16 Claims, 1 Drawing Sheet

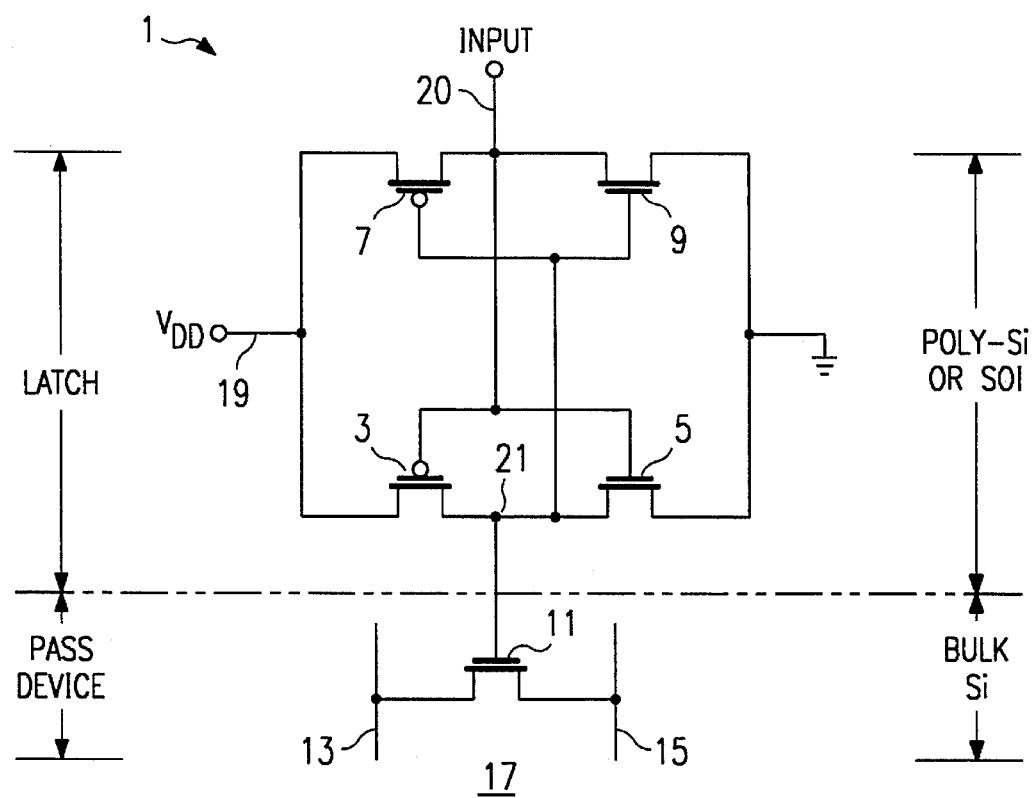

THREE DIMENSIONAL INTEGRATED LATCH AND BULK PASS TRANSISTOR FOR HIGH DENSITY FIELD RECONFIGURABLE ARCHITECTURE

BACKGROUND OF THE INVENTION

1. Field of the Invention

This invention relates to a three dimensionally structured latch and pass transistor which is useful, for example, in conjunction with field programmable gate arrays (FPGAs) and the like and, more specifically, for providing high density field reconfigurable programmable gate array architectures.

2. Brief Description of the Prior Art

Prior art field programmable gate arrays have generally been of two types. The first type of FPGA uses an anti-fuse as the pass element wherein two runs of metal which are normally separated and have an open circuit therebetween are short circuited to each other when so programmed by a metal run or interconnect therebetween. Such devices are one time programmable and cannot be reconfigured after initial programming.

A second type of FPGA uses a static random access memory (SRAM) based element and a pass transistor between the metal runs which is controlled by the SRAM or latch. The pass transistor is turned on when the programming as applied to the SRAM calls for short circuiting of the metal runs to each other. This type of FPGA is reconfigurable since the short circuit between the metal runs can be removed by reprogramming the SRAM to the opposite state, thereby turning off the pass transistor and providing an open circuit between the metal runs.

While the second type of FPGA as described hereinabove can properly provide the function for which it is designed, both the SRAM and the pass device have always been fabricated in bulk silicon. Accordingly, the FPGA has been two dimensional and therefore presented limitations on the density of elements that can be incorporated into the array for a given area.

SUMMARY OF THE INVENTION

In accordance with the present invention, the above described inadequacies of the prior art are minimized and there is provided a combination latch and pass transistor for high density field architectures.

Briefly, this is accomplished by providing bulk silicon with a layer of polysilicon or silicon on insulator (SOI) thereover. The pass transistor, which must have very low resistance to provide a good short circuit path between the metal runs and fast switching speed, is fabricated in the bulk silicon wherein the resistivity can be made very low relative to polysilicon and because only the pass transistor is disposed in the bulk silicon, thereby permitting the dimensions thereof to be increased to provide even lower resistance. Since only the latch is fabricated in the layer of polysilicon or SOI and is disposed over the pass transistor, the amount of chip area utilized can be the same or less than required in the prior art wherein all circuitry was in the bulk silicon. While the resistivity in the polysilicon will be higher than in the bulk silicon, the latch can operate adequately under such conditions of high resistivity since high speed operation thereof is not of importance in the environment in question.

The very low resistance path of the pass transistor allows for faster response time, and the three dimensional integration of the latch can save space, thereby obtaining both speed and density advantage.

BRIEF DESCRIPTION OF THE DRAWING

The FIGURE is a circuit diagram of a three dimensional integrated latch and bulk silicon pass transistor for high density field reconfigurable architectures in accordance with the present invention.

DESCRIPTION OF THE PREFERRED EMBODIMENT

Referring to the FIGURE, there is shown a standard latch circuit 1 having an input terminal and reference or ground terminal. A pair of series circuits are connected in parallel between the input terminal and ground terminal, each of the series circuits including a p-channel transistor 3,7 in series with an n-channel transistor 5,9. The gates of the transistors of each series circuit are connected to each other and to the junction of the p-channel and n-channel transistors of the other series circuit. The junction of the p-channel transistor 3 and the n-channel transistor 5 is connected to the gate of an n-channel pass transistor 11 which is coupled between metal runs 13 and 15.

In operation, the pass transistor 11 will be on or off, depending upon the status of the latch 1. When the latch 1 provides a high signal to the gate of pass transistor 11, this transistor will be on and provide a short circuit between the metal runs 13 and 15. When the latch 1 provides a low signal to the gate of pass transistor 11, this transistor will be off and provide an open circuit between the metal runs 13 and 15. The status of the latch 1 can be changed by providing an appropriate signal to the input of the latch at terminal 20. For example, if a logical "1" is applied to the input terminal 20, then the terminal 21 of the latch is programmed to be logical "0" with the result that the pass transistor 11 is held off. However, if a logical "0" is temporarily applied to terminal 20, then a logical "1" is programmed into terminal 21, which will allow the pass transistor 11 to be turned on.

The circuit of the FIGURE is fabricated by first providing a region of bulk or monocrystalline silicon 17 with a layer of polysilicon or SOI 19 thereover. The pass transistor 11 is fabricated in the bulk silicon 17 with the source/drain terminals thereof coupled to the metal runs 13 and 15. The metal runs can be disposed on the bulk silicon 17 and be exposed or beneath the layer of polysilicon 19 or the metal runs 13 and 15 can be disposed over the layer of polysilicon. The gate of pass transistor 11 can be on the surface of the bulk silicon 17 as a metal layer or be a portion of the polysilicon layer 19 with an insulating layer (not shown) disposed between the polysilicon gate and the bulk silicon. The latch 1 is fabricated in the layer of polysilicon 19 with a connection to the gate of transistor 11 by way of a via and metallization to the gate of transistor 11 if the gate is a layer of metal or by interconnect to the gate in the polysilicon layer if the gate is a part of the polysilicon layer. While pass transistor 11 is shown in the preferred embodiment as being connected between a pair of metal runs 13 and 15, it should be understood that the connection can be made to any two points which are to be periodically or permanently connected together and disconnected, especially when a high speed, low resistance interconnection is required.

It can be seen that there has been provided a three dimensional latch and bulk silicon pass transistor wherein the latches and pass transistors can be fabricated in a densely packed array since the pass transistor is disposed directly below the latch and therefore does not occupy additional chip area. Additionally, the pass transistor remains of high quality and low resistance since it is fabricated in the bulk silicon.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A latch controlled pass transistor circuit which comprises:
   (a) a region of monocrystalline silicon;
   (b) a layer of one of polycrystalline silicon or a silicon on insulator (SOI) region disposed over said monocrystalline silicon;
   (c) a latch circuit disposed in one of said layer of polycrystalline silicon or SOI region; and
   (d) a pass transistor disposed in said region of monocrystalline silicon and rendered on or off responsive to the state of said latch.

2. A circuit as set forth in claim 1 wherein said pass transistor is coupled between a pair of one of metal runs or conductive lines.

3. A circuit as set forth in claim 1 wherein said pass transistor includes a gate electrode, the voltage on said gate electrode responsive to the state of said latch.

4. A circuit as set forth in claim 2 wherein said pass transistor includes a gate electrode, the voltage on said gate electrode responsive to the state of said latch.

5. A circuit as set forth in claim 1 wherein said latch circuit is physically disposed directly over said pass transistor.

6. A circuit as set forth in claim 2 wherein said latch circuit is physically disposed directly over said pass transistor.

7. A circuit as set forth in claim 3 wherein said latch circuit is physically disposed directly over said pass transistor.

8. A circuit as set forth in claim 4 wherein said latch circuit is physically disposed directly over said pass transistor.

9. A circuit as set forth in claim 3 wherein said latch is coupled to said gate of said pass transistor.

10. A circuit as set forth in claim 4 wherein said latch is coupled to said gate of said pass transistor.

11. A circuit as set forth in claim 7 wherein said latch is coupled to said gate of said pass transistor.

12. A circuit as set forth in claim 8 wherein said latch is coupled to said gate of said pass transistor.

13. The circuit of claim 1 wherein said latch circuit includes an input to change the state of said latch.

14. The circuit of claim 4 wherein said latch circuit includes an input to change the state of said latch.

15. The circuit of claim 8 wherein said latch circuit includes an input to change the state of said latch.

16. The circuit of claim 12 wherein said latch circuit includes an input to change the state of said latch.

* * * * *